(12) United States Patent
Rasheed et al.

(10) Patent No.: US 10,214,815 B2
(45) Date of Patent: Feb. 26, 2019

(54) SURFACE TREATED ALUMINUM NITRIDE BAFFLE

(71) Applicant: APPLIED MATERIALS, INC., Santa Clara, CA (US)

(72) Inventors: Muhammad M. Rasheed, Fremont, CA (US); Dmitry Lubomirsky, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 643 days.

(21) Appl. No.: 14/947,594

(22) Filed: Nov. 20, 2015

(65) Prior Publication Data

US 2016/0145743 A1    May 26, 2016

Related U.S. Application Data

(62) Division of application No. 12/195,127, filed on Aug. 20, 2008, now Pat. No. 9,222,172.

(51) Int. Cl.
*C23C 16/455*  (2006.01)
*H01L 21/285*  (2006.01)
(Continued)

(52) U.S. Cl.
CPC ...... *C23C 16/45591* (2013.01); *C04B 35/581* (2013.01); *C04B 40/0092* (2013.01);
(Continued)

(58) Field of Classification Search
CPC .......... C23C 16/45591; C23C 16/4404; C23C 16/45565; C23C 16/45563;
(Continued)

(56) References Cited

U.S. PATENT DOCUMENTS 6,039,631 A   3/2000   Sato et al.
6,383,964 B1  5/2002   Nakahara et al.
(Continued)

FOREIGN PATENT DOCUMENTS

JP   H06-163428 A   6/1994
JP   06-191953      7/1994
(Continued)

OTHER PUBLICATIONS

International Search Report and Written Opinion dated Mar. 2010 for PCT Application No. PCT/US2009/054416.

*Primary Examiner* — Jeffrie R Lund
(74) *Attorney, Agent, or Firm* — Moser Taboada; Alan Taboada

(57) ABSTRACT

Methods and apparatus relating to aluminum nitride baffles are provided herein. In some embodiments, a baffle for use in semiconductor process chambers may include a body comprising aluminum nitride and a metal oxide binding agent, wherein a ratio of aluminum nitride to metal oxide on a surface of the body is greater than or equal to the ratio within the body. In some embodiments, the body may have a center stem and an outer annulus coupled to and extending radially outwards from a lower portion of the center stem. In some embodiments, a method of fabricating a baffle may include sintering aluminum, nitrogen, and a metal oxide binding agent to form a body of the baffle, the body having excess metal oxide binding agent disposed on a surface thereof; and removing a bulk of the excess metal oxide binding agent from a surface of the body.

12 Claims, 4 Drawing Sheets

(51) Int. Cl.
  *H01L 21/02* (2006.01)
  *C04B 40/00* (2006.01)
  *C04B 35/581* (2006.01)
  *H01J 37/32* (2006.01)
  *C23C 16/44* (2006.01)

(52) U.S. Cl.
  CPC .... *C23C 16/4404* (2013.01); *H01J 37/32449* (2013.01); *H01L 21/0262* (2013.01); *H01L 21/02271* (2013.01); *H01L 21/28556* (2013.01); *C23C 16/45563* (2013.01); *C23C 16/45565* (2013.01)

(58) Field of Classification Search
  CPC ........... H01L 21/28556; H01L 21/0262; H01L 21/02271; C04B 40/0092; C04B 35/581; H01J 37/32449
  USPC ....................................................... 118/715
  See application file for complete search history.

(56) References Cited

U.S. PATENT DOCUMENTS

| | | | |
|---|---|---|---|
| 7,740,706 | B2 | 6/2010 | Park et al. |
| 9,222,172 | B2* | 12/2015 | Rasheed ............. C23C 16/4404 |
| 2002/0000431 | A1 | 1/2002 | Natsuhara et al. |
| 2003/0071260 | A1 | 4/2003 | Ootsuka et al. |
| 2003/0150563 | A1 | 8/2003 | Kuibara et al. |
| 2004/0063333 | A1 | 4/2004 | Saigusa et al. |
| 2006/0118045 | A1 | 6/2006 | Fink |
| 2006/0196603 | A1 | 9/2006 | Lei et al. |
| 2010/0048028 | A1 | 2/2010 | Rasheed et al. |
| 2012/0168802 | A1 | 7/2012 | Hirotsuru et al. |
| 2016/0145743 | A1* | 5/2016 | Rasheed ............. C23C 16/4404 438/758 |

FOREIGN PATENT DOCUMENTS

| | | |
|---|---|---|
| JP | H06-219844 A | 8/1994 |
| JP | 2000086346 | 3/2000 |
| JP | 2001-233676 A | 8/2001 |
| JP | 2007-042672 | 2/2007 |
| JP | 2008-53390 | 3/2008 |

* cited by examiner

SURFACE TREATED ALUMINUM NITRIDE BAFFLE

CROSS-REFERENCE TO RELATED APPLICATIONS

This application is a divisional of co-pending U.S. patent application Ser. No. 12/195,127 filed on Aug. 20, 2008, which is herein incorporated by reference.

FIELD

Embodiments of the present invention generally relate to semiconductor processing equipment and more particularly to an aluminum nitride baffle for processing semiconductor substrates.

BACKGROUND

In some high density plasma chemical vapor deposition (HDP-CVD) processing chambers, a baffle may be used for gas injection and distribution during substrate processing. Baffles for HDP-CVD chambers have typically been constructed from aluminum oxide ($Al_2O_3$). However, with the use of the high RF power HDP-CVD processes to access smaller device nodes, elevated temperatures result in the reaction of the aluminum oxide with process gases, for example, nitrogen trifluoride ($NF_3$), which can be used as a cleaning gas for HDP-CVD chambers. Thus, owing to improved thermal conductivity, among other factors, aluminum oxide baffles have been replaced with aluminum nitride (AlN) baffles.

Unfortunately, although aluminum nitride baffles have some favorable properties, other problems remain. For example, aluminum nitride baffles are commonly manufactured by a sintering process that includes metal oxide binding agents. The metal oxide binding agents contribute to the high thermal conductivity of the sintered aluminum nitride. However, these binding agents, present on the surface of the baffle after sintering, undesirably interfere with the adhesion of a silicon oxide ($SiO_2$) layer during seasoning of the baffle prior to substrate processing. Seasoning, for instance, can prevent contamination of a substrate by materials of the baffle, and can protect the baffle from reactive gases during processing or cleaning. However, the poorly adhered silicon oxide seasoning layer can flake off the surface of the baffle, thus contaminating a substrate being processed, and may also leave the baffle susceptible to damage from reactive gases supplied during substrate processing or chamber cleaning. Although this problem may be eliminated by not using metal oxide binding agents, such an approach would undesirably reduce the thermal conductivity of the baffle.

Thus, there is a need in the art for improved aluminum nitride baffles and methods for manufacturing the same.

SUMMARY

Methods and apparatus relating to an aluminum nitride baffle are provided herein. In some embodiments, a baffle for use in a semiconductor process chamber may include a body comprising aluminum nitride and a metal oxide binding agent, wherein a ratio of aluminum nitride to the metal oxide binding agent on a surface of the body is greater than or equal to the ratio within the body. In some embodiments, the body may have a center stem and an outer annulus coupled to and extending radially outwards from a lower portion of the center stem.

In some embodiments, an apparatus for processing a semiconductor substrate may include a process chamber having an inner volume and a first gas inlet disposed in a ceiling thereof; and a baffle coupled to the first gas inlet and configured to direct the flow of a first process gas from the first gas inlet to the inner volume, the baffle including a body comprising aluminum nitride and a metal oxide binding agent, wherein a ratio of aluminum nitride to the metal oxide binding agent on a surface of the body is greater than or equal to the ratio within the body.

In some embodiments, a baffle for use in a semiconductor process chamber may be formed by a process including sintering aluminum, nitrogen and a metal oxide binding agent to form a body of the baffle, the body having excess metal oxide binding agent disposed on a surface thereof; and removing a bulk of the excess metal oxide binding agent from the surface.

In some aspects of the invention, a method of fabricating a baffle for use in a semiconductor process chamber is provided. In some embodiments, a method of fabricating a baffle for use in a semiconductor process chamber may include sintering aluminum, nitrogen and a metal oxide binding agent to form a body of the baffle, the body having excess metal oxide binding agent disposed on a surface thereof; and removing a bulk of the excess metal oxide binding agent from a surface of the body.

In some aspects of the invention, a method of processing a semiconductor substrate is provided. In some embodiments, a method of processing a semiconductor substrate may include placing a substrate on a substrate support in a process chamber having an inner volume and a first gas inlet disposed in a ceiling of the process chamber opposite the support pedestal; flowing a first process gas through a baffle coupled to the first gas inlet and into the inner volume, the baffle comprising an aluminum nitride body having metal oxide binding agents, wherein a ratio of aluminum nitride to the metal oxide binding agent on a surface of the body is greater than or equal to the ratio within the body; and processing the substrate with the first process gas.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Figure 1:
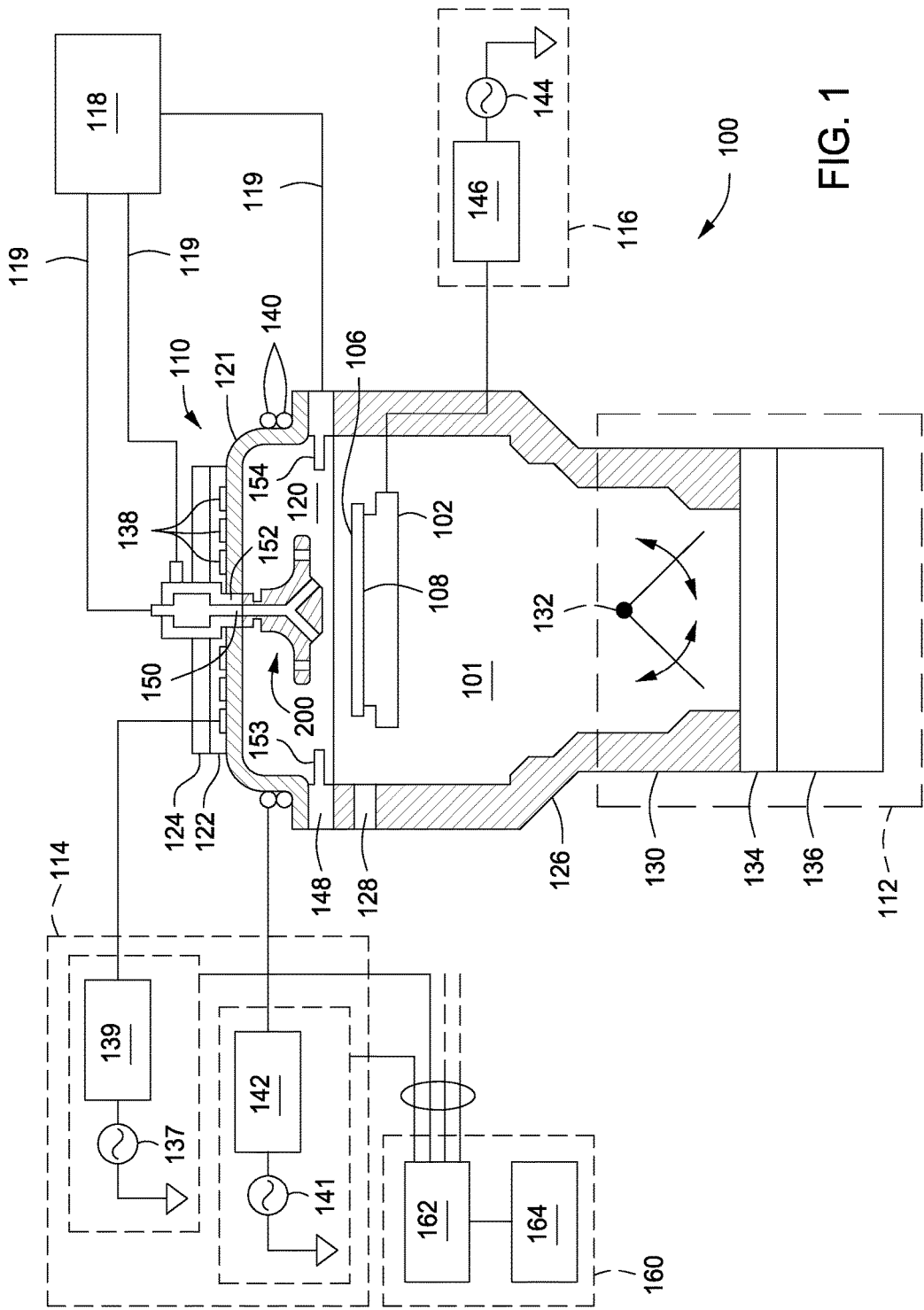
FIG. 1 depicts a schematic diagram of an illustrative process chamber used in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Methods and apparatus for processing semiconductor substrates using an improved aluminum nitride baffle are provided herein. In some embodiments, a baffle for use in a semiconductor process chamber includes a body comprising aluminum nitride and a metal oxide binding agent. A ratio of aluminum nitride to metal oxide on a surface of the body is greater than the ratio within the body. The reduced quantity of metal oxide on the surface of the body facilitates improved adhesion of a silicon oxide seasoning layer to the surface of the baffle, which may further prevent contamination of a substrate during processing by particles that may otherwise flake off of the aluminum nitride baffle, and may further protect the baffle from damage by reactive process gases. In some embodiments, a method of manufacturing the aluminum nitride baffle is provided. The manufacturing method may advantageously facilitate fabricating an aluminum nitride baffle having a ratio of aluminum nitride to metal oxide on a surface of the body is greater than the ratio within the body.

The aluminum nitride baffle of the present invention may be utilized in a suitable process chamber, such as one adapted for performing high density plasma chemical vapor deposition (HDP-CVD). The process chamber may be configured as single chamber, or alternatively may be integrated as part of a cluster tool. Two such suitable systems are the 300 mm HDP-CVD ULTIMA X and CENTURA® ULTIMA HDP-CVD both available from Applied Materials, Inc. It is contemplated that an HDP-CVD chamber is merely one exemplary chamber in which the aluminum nitride baffle may be utilized. Any suitable chamber having one or more gas inlets adapted to receive an aluminum nitride baffle can benefit from the embodiments of the present invention.

FIG. 1 depicts a schematic diagram of an illustrative HDP-CVD chamber 100 having a baffle 200 in accordance with some embodiments of the present invention. The HDP-CVD chamber 100 may be used for temperature controlled processing of the substrates, such as silicon (Si) substrates, gallium arsenide (GaAs) substrates and the like, while creating and maintaining a plasma environment in which the substrates are processed. The plasma is created in the vicinity of the substrate during the processing of the substrate, and the temperature of the substrate is controlled using various techniques, such as, by supplying a heat transfer fluid to back surface of the substrate.

The HDP-CVD chamber 100 includes a process chamber 110 having an inner volume 101 with a substrate support 102 and having the baffle 200 disposed therein. The process chamber 100 may further include a vacuum system 112, a source plasma system 114, a bias plasma system 116, a gas delivery system 118, and a remote plasma cleaning system (not shown).

The substrate support 102 may be disposed in the process chamber 110 to support a substrate 106 positioned thereupon during the processing. The substrate support 102 may include various components, such as an electrostatic chuck 108 to clamp the substrate 106 to the substrate support 102, or other components as described in more detail below. A process kit (not shown) may optionally be used to cover at least one portion of the substrate support 102 that is not covered by the substrate 106 when the substrate 106 is disposed thereon. The process kit may be configured to provide reduced contamination of surface of the substrate 106 during the processing, and reduced cleaning time during chamber cleaning processes.

An upper portion of process chamber 110 may include a dome 121, which may be made of a dielectric material, such as alumina or aluminum nitride. The dome 121 defines an upper boundary of a plasma processing region 120. The plasma processing region 120 is bounded on the bottom by the substrate 106 and the substrate support 102.

A heater plate 122 and a cold plate 124 surmount, and are thermally coupled to, the dome 121. The heater plate 122 and the cold plate 124 allow control of the dome temperature to within about +/−10 degrees Centigrade over a range of about 100 to 200 degrees Centigrade. This allows optimizing the dome temperature for the various processes. For example, it may be desirable to maintain the dome at a higher temperature for cleaning or etching processes than for deposition processes. Accurate control of the dome temperature also reduces the flake or particle counts in the process chamber and improves adhesion between the deposited layer and the substrate.

The dome 121 may include a top nozzle 150 and a top vent 152 disposed (e.g., a third gas inlet) therein and therethrough, which may be utilized to introduce gases into the process chamber 110 as discussed further below with respect to the gas delivery system 118. The top nozzle 150 is coupled to the baffle 200 at a gas inlet (e.g., gas inlet 208 discussed below with respect to FIG. 2A) and the top vent 152 is open to the process chamber 110 and is directed towards a backside of the baffle 200 (e.g., backside 203 discussed below with respect to FIG. 2A), as discussed below with respect to FIGS. 1 and 2A-B.

Figure 2A:
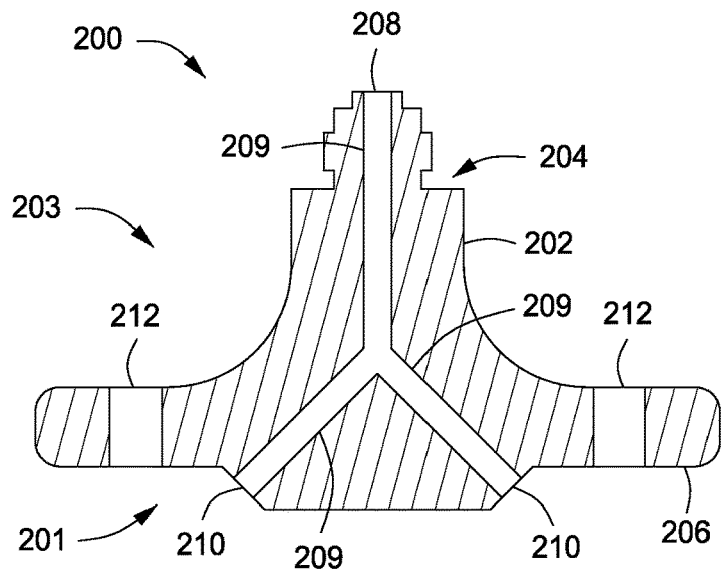
FIGS. 2A-B depict a schematic diagram of a baffle in accordance with some embodiments of the present invention.
Figure 2B:
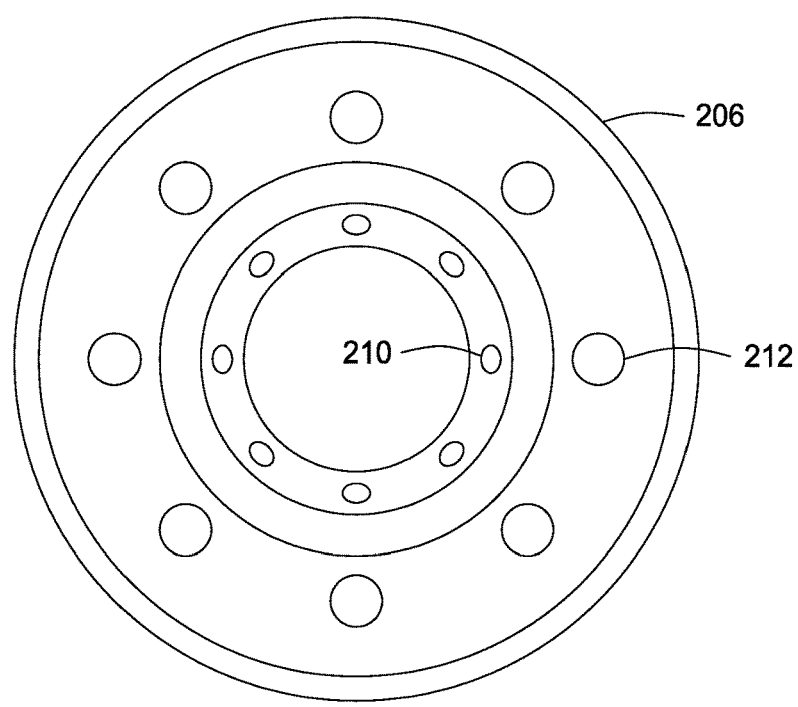

Referring to FIG. 2A-B, the baffle 200 generally includes a body 202 having a shape for directing process gases as desired within the process chamber. For example, the baffle 200 may be disposed between a gas inlet (such as top nozzle 150 depicted in FIG. 1) and a substrate support (such as substrate support 102 depicted in FIG. 1) and may include a backside 203 separated from and opposing the dome 121 (depicted in FIG. 1), and a frontside 201 disposed opposite the substrate 106 and substrate support 102 (depicted in FIG. 1) in order to direct the process gases as desired. The baffle 200 generally comprises aluminum nitride and a metal oxide binding agent. The baffle 200 has a ratio of aluminum oxide to metal oxide on a surface of the body 202 that is greater than the ratio of aluminum oxide to metal oxide within the body 202.

Figure 3:
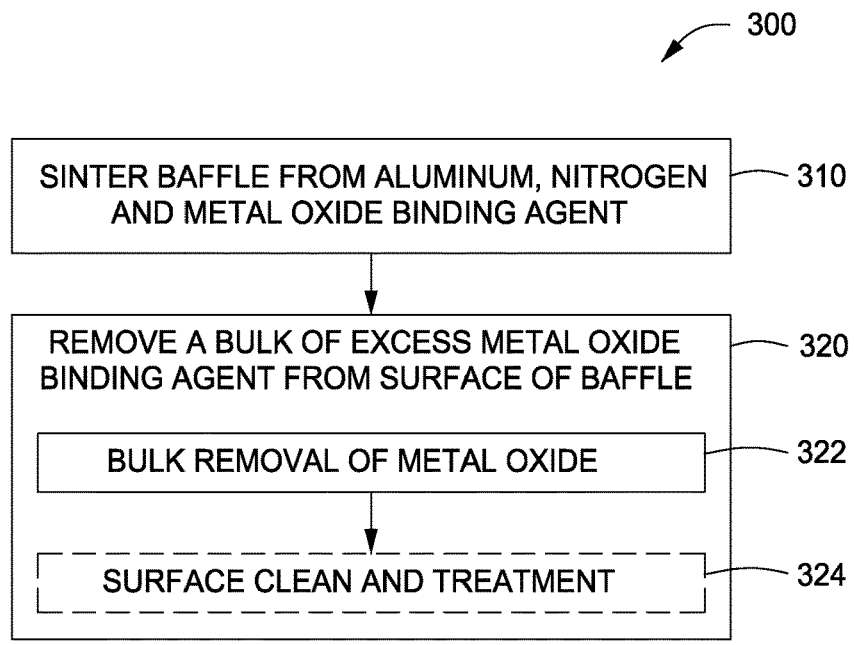
FIG. 3 depicts a flow chart for a method of fabrication of a baffle in accordance with some embodiments of the present invention.

Methods for fabricating aluminum nitride baffles including a discussion of the metal oxide binding agent and the ratio of aluminum oxide to metal oxide are discussed below with respect to FIG. 3, which depicts a flow chart illustrating a method 300 for fabricating an aluminum nitride baffle in accordance with some embodiments of the present invention.

The method 300 begins at 310 where the baffle 200 (or the body 202) may be sintered from aluminum, nitrogen, and a metal oxide binding agent. Generally, a sintering process includes heating powders below their melting points under pressure until the powders adhere together to form a solid object (e.g., body 202). In some embodiments, an aluminum nitride powder and a metal oxide powder may be sintered to form the body 202.

The metal oxide binding agent may be used to facilitate the adhesion of particles of aluminum nitride, and to improve thermal conductivity the baffle 200. In some embodiments, the metal oxide binding agent includes at least one of yttrium oxide or erbium oxide. The metal oxide binding agent can be added to an aluminum nitride powder and then sintered, or alternatively, the aluminum nitride powder may comprise sufficient amounts of metal oxide impurities such that no additional metal oxide agents are required prior to sintering. In some embodiments, between about 0.1 to about 10 percent by mass of metal oxide may be present in the baffle 200.

Figure 5A:
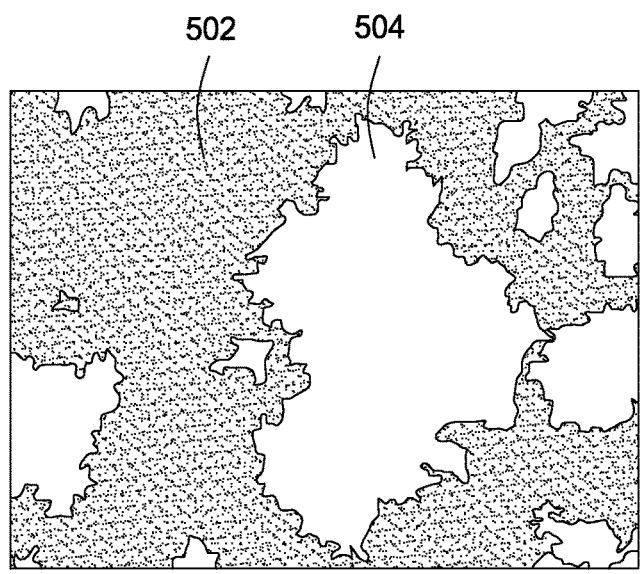
FIGS. 5A-B respectively depict views of the surface of a conventional baffle under varying magnifications.
Figure 5B:
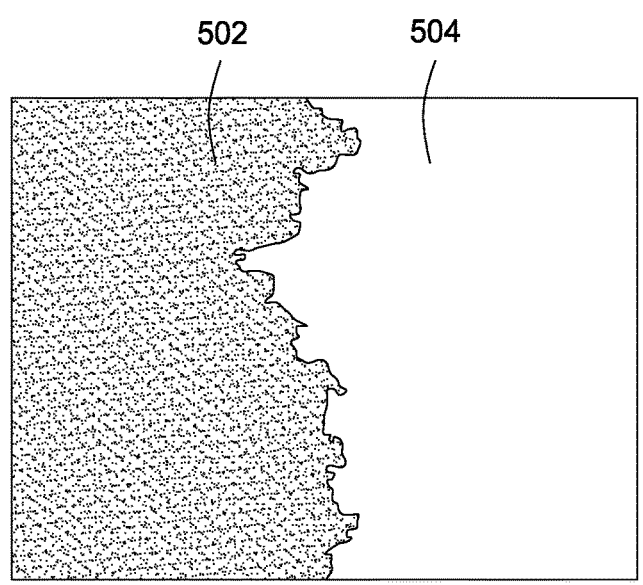

The inventors have observed several problems with conventional aluminum nitride baffles. For example, the inventors have observed that uneven coatings, such as silicon oxide seasoning layers, tend to develop on the surface of the conventional aluminum nitride baffles. Such uneven coatings may lead to flaking of the coating (for example due to uneven build-up of the coating or due to loose grains of metal oxide on the surface of the baffle) and subsequent possible contamination of the substrate, exposure of a baffle to damaging process gases, and the like. Investigating this problem, the inventors have observed that, utilizing conventional sintering techniques, the sintering process results in a baffle having excess metal oxide disposed on the surface of the baffle. For example, FIG. 5A depicts a schematic representation of an actual surface of an aluminum nitride baffle, viewed at 100× magnification, clearly showing regions of excess metal oxide 504 present on the surface of the aluminum nitride 502. The regions of excess metal oxide 504 are seen as whitish or light-colored regions atop the much darker aluminum nitride 502. FIG. 5B depicts a schematic representation of an actual surface of an aluminum nitride baffle, viewed at 500× magnification, clearly showing regions of excess metal oxide 504 present on the surface of the aluminum nitride 502. As more clearly seen in the more magnified view of FIG. 5B, the grain structure of the excess metal oxide 504 is very different than the grain structure of the aluminum nitride 502. Moreover, the excess metal oxide 504 is seen to be formed in regions, or "islands," disposed atop the aluminum nitride 502, as compared to being more uniformly disposed or integrated within the aluminum nitride 502. The excess metal oxide disposed on the surface may be present in larger quantities than generally throughout the body due to squeeze-out and migration of the metal oxide binding agents during the sintering process. The inventors believe that the problems observed in conventional baffles may be due, at least in part, to the presence of the excess metal oxide on the surface of the aluminum nitride baffle.

Thus, the inventors believe that eliminating or reducing the excess metal oxide on the surface of the baffle may provide advantages over conventional aluminum nitride baffles. Accordingly, in some embodiments, the baffle 200 may have a ratio of aluminum nitride to metal oxide on the surface of the body 202 that is greater than or equal to the ratio within the body 202. In some embodiments, the baffle 200 may have substantially no excess metal oxide on the surface of the body 202.

Returning to FIG. 3, at 320, a bulk (e.g., most) of the excess metal oxide binding agent is removed from the surface of the baffle 200 (e.g., the body 202). In some embodiments, the bulk of the excess metal oxide binding agent may be removed from the surface of the baffle 200, or the body 202, in a bulk removal step, for example, by at least one of sand blasting, grit blasting, wet blasting, mechanical grinding, mechanical polishing, or the like (as shown at 322 in FIG. 3). In some embodiments, a surface clean and treatment step may include cleaning with a corrosive acid (as shown at 324 in FIG. 3). Suitable corrosive acids may include nitric acid ($HNO_3$), hydrochloric acid (HCl), silicon hydride ($SiH_4$), or the like. The corrosive acid may be diluted to an appropriate strength in de-ionized (DI) water. The cleaning solution of the corrosive acid and DI water may be weak or aggressive as necessary to provide a final removal of metal oxide and/or treatment of the aluminum nitride surface of the baffle. The surface cleaning and treatment of the aluminum nitride may not only facilitate removal of any excess metal oxide on or near the surface of the baffle, but may also etch or otherwise modify the surface of the aluminum nitride baffle to promote greater adhesion of a layer formed thereupon (such as a silicon oxide seasoning layer).

The removal of the excess metal oxide binding agent from the surface of the baffle 200 (or body 202) facilitates providing a baffle having a ratio of aluminum nitride to metal oxide on the surface of the body that is greater than or equal to the ratio within the body (e.g., the surface is a predominantly similar amalgamation of aluminum nitride and metal oxide binding agents as in the body). For example, in comparison to the views of the surface of a conventional baffle, as shown in FIGS. 5A-B, observing the surface of the baffle 200 shows no visually detectable metal oxide on the surface of the baffle 200 at the same magnifications.

Upon completion of the removal of the bulk of the excess metal oxide from the surface of the baffle 200, the method 300 generally ends and the baffle 200 may be further processed as necessary or installed into a process chamber, as discussed above with respect to FIG. 1.

Returning to FIG. 2, in some embodiments, the baffle 200 may have a center stem 204 and an outer annulus 206, although other geometries may be utilized in other chambers or applications. The center stem 204 includes a gas inlet 208 disposed in an upper portion of the center stem 204 for coupling the center stem 204 to the top nozzle 150, as describe above with respect to FIG. 1. The center stem 204 may further include a plurality of gas outlets 210 disposed in a lower portion of the center stem 204 and fluidly coupled to the gas inlet 208 via channels 209. The plurality of gas outlets 210 facilitate the flow of gases from the top nozzle 150 to the frontside 201 of the baffle 200 via the gas inlet 208.

As illustrated in FIG. 2A, the lower portion of the center stem 204 may have a raised surface on the frontside 201 with respect to the surface of the outer annulus 206 on the frontside 201 of the baffle 200. In some embodiments, the raised surface may be utilized to direct the flow of a gas from each gas outlet 210 such that the gas exiting each gas outlet 210 flows at angle with respect to a central axis of the baffle 200 (or to a central axis of a substrate disposed therebeneath). However, the lower portion of the center stem 204 may alternatively have a flush, depressed, or other surface geometry on the frontside 201 of the baffle 200. Moreover, one or more of the plurality of gas outlets 210 can be oriented parallel, perpendicular, or at any suitable angle therebetween to facilitate flow of a gas to the surface of the substrate 106.

Referring to FIG. 2B, in some embodiments, the plurality of gas outlets 210 may be evenly spaced in a circular pattern on the frontside 201 of the baffle 200. Alternatively, the plurality of gas outlets 210 may be spaced in any suitable pattern necessary to facilitate the flow of a gas to the surface of the substrate 106, and as such their configuration is not limited to being evenly or circularly spaced.

Returning to FIG. 2A, in some embodiments, the outer annulus 206 may include a plurality of holes 212 disposed therethrough. The plurality of holes 212 may facilitate the flow of a gas from the backside 203 to the frontside 201 of the baffle 200. Further, the outer annulus 206 may additionally, or in the absence of the plurality of holes 212, facilitate the flow of a gas from the backside 203 to the frontside 201 via the gas flowing around the edge of the outer annulus 206. For example, gases supplied to the backside 203 of the baffle 200 via the top vent 152, as shown in FIG. 1 may be partially diverted around the outer annulus 206 and may partially flow through the plurality of holes 212 formed in the outer annulus 206 to provide a desired distribution of a gas within the process chamber.

Referring to FIG. 2B, the plurality of holes 212 may be evenly arranged, for example, in a circular pattern. In some embodiments, each hole 212 may be disposed between each gas outlet 210, as illustrated. Alternatively each hole 212 may be aligned with or oriented in any suitable arrangement relative to each gas outlet 210 to facilitate the flow of process gases within the process chamber.

Returning to FIG. 1, a lower portion of the process chamber 110 may include a body member 126, which joins the process chamber 110 to the vacuum system 112. The substrate support 102 may be mounted in the body member 126. The electrostatic chuck 108 or other mechanism may be provided within or upon the substrate support 102 to secure the substrate 106 to the substrate support 102. The substrate 106 may be transferred into and out of the process chamber 110 by a robot blade (not shown) through an insertion/removal opening 128 inside of the process chamber 110. A pneumatic actuator (not shown) raises and lowers a lift-pin plate (not shown) that raises and lowers lift pins (not shown) that raise and lower the substrate 106. Upon transfer into the process chamber 110, the substrate 106 is disposed on the raised lift pins, and then lowered onto the surface of the substrate support 102.

The vacuum system 112 includes a throttle body 130, which houses multi-blade throttle valve 132 and is attached to a gate valve 134 and a turbomolecular pump 136. The throttle body 130 may offer minimum obstruction to gas flow, and allow symmetric pumping. The gate valve 134 may isolate the turbomolecular pump 136 from the throttle body 130, and further control pressure of the process chamber 110 by restricting exhaust flow capacity when the throttle valve 132 is fully open. The arrangement of the throttle valve 132, the gate valve 134, and the turbomolecular pump 136 allow an accurate and stable control of the pressure from about 1 to 100 mTorr.

The source plasma system 114 includes a top coil 138 and a side coil 140, mounted on the dome 121. A symmetrical ground shield (not shown) reduces electrical coupling between the top coil 138 and the side coil 140. The top coil 138 is powered by a top RF source generator 137, while the side coil 140 is powered by a side RF source generator 141, allowing independent power levels and frequencies of operation for each coil. This dual coil system allows control of the radial ion density in the process chamber 110, thereby improving plasma uniformity. The side coil 140 and the top coil 138 couple energy into the process chamber 110 inductively. The top RF source generator 137 may provide up to 8000 W of RF power at nominally 2 MHz and the side RF source generator 141 may provide up to 8000 W of RF power at nominally 2 MHz. Operating frequencies of the top RF generator 137 and the side RF generator 141, may be offset from the nominal operating frequency (e.g., to 1.7-1.9 MHz and 1.9-2.1 MHz, respectively) to improve plasma-generation efficiency.

In some embodiments, the RF generators 137 and 141 include digitally controlled synthesizers and operate over a frequency range from about 1.7 to about 2.1 MHz. Each of the RF generators 137 and 141 includes an RF control circuit (not shown) that measures reflected power from the process chamber 110 and the coils 138 and 140, back to the generator, and adjusts the operating frequency to obtain the lowest reflected power, as understood by a person of ordinary skill in the art. The RF generators 137 and 141 are typically designed to operate into a load with a characteristic impedance of 50 ohms. RF power may be reflected from loads that have different characteristic impedance than the generator. This may reduce power transferred to the load. Additionally, power reflected from the load back to the generator may overload and damage the generator. Because the impedance of the plasma may range from less than 5 ohms to over 900 ohms, depending on the plasma ion density among other factors, and because the reflected power may be a function of frequency, adjusting the generator frequency according to the reflected power increases the power transferred from the RF generator to the plasma and protects the generator. Another way to reduce reflected power and improve efficiency is with a matching network.

Matching networks 139 and 142 match the output impedance of the RF generators 137 and 141 with the coils 138 and 140, respectively. The RF control circuit may tune the matching networks 139 and 142 by changing value of capacitors within the matching networks 139 and 142 to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help to stabilize the plasma under some conditions by holding the matching network constant at its most recent condition.

The bias plasma system 116 includes a RF bias generator 144 and a bias matching network 146. The bias plasma system 116 may capacitively couple the electrostatic chuck 108 to the body member 126, which acts as complementary electrodes. The bias plasma system 116 serves to enhance the transport of the plasma species created by the source plasma system 114 to the surface of the substrate 106. In some embodiments, the RF bias generator 144 may provide up to 10000 W of RF power at 13.56 MHz.

Other measures may also help stabilize the plasma. For example, the RF control circuit can be used to determine the power delivered to the load (plasma) and may increase or decrease the generator output power to keep the delivered power substantially constant during deposition of a layer.

The gas delivery system 118 may include multiple gas sources (not shown). In some embodiments, the gas sources may comprise silane, molecular oxygen, helium, argon, and the like. The gas delivery system 118 provides gases from several sources to the process chamber 110 for processing the substrate 106 via gas delivery lines 119 (only some of which are shown). Gases are introduced into the process chamber 110 through a gas ring 148, the top nozzle 150, and the top vent 152. The gas sources may be provided to the gas ring 148, the top nozzle 150, and the top vent 152 via flow controllers (not shown) and the gas delivery line 119. The gas delivery line 119 may have a flow controller (not shown)

to control the flow rate of a process gas. The top nozzle 150 and the top vent 152 allow independent control of top and side flows of the gases, which improves film uniformity and allows fine adjustment of the deposition layer and doping parameters. The top vent 152 is an annular opening around the top nozzle 150 through which the gas may flow into the process chamber 110 from the gas delivery system 118.

The gas is provided from one or more gas sources of the gas delivery system 118 to the gas ring 148 via flow controllers and the gas delivery lines 119. The gas ring 148 has multiple gas nozzles 153 and 154 (only two of which is shown) that provide a uniform flow of the gas over the substrate 106. Nozzle length and nozzle angle may be changed by changing the gas ring 148. This allows tailoring the uniformity profile and gas utilization efficiency for a particular process within the process chamber 110. In some embodiments, the gas nozzles 154 (only one of which is shown), are coplanar with, and shorter than, the second gas nozzles 153.

In some embodiments of the present invention, flammable, toxic, or corrosive gases may be used. In these instances, it may be desirable to eliminate gas remaining in the gas delivery lines 119 after a deposition. This may further be accomplished by using one or more three-way valves (not shown), to isolate the process chamber 110 from one or more gas delivery lines 119, and to vent the one or more gas delivery lines 119 to a vacuum foreline (not shown). The three-way valves may be placed as close to the process chamber 110 as practical, to minimize the volume of the unvented gas delivery line (between the three-way valve and the process chamber). Additionally, two-way (on-off) valves (not shown) may be placed between a mass flow controller (MFC) and the process chamber 110 or between the gas source and an MFC.

The HDP-CVD chamber 100 may further include a remote cleaning RF plasma source (not shown) for providing a cleaning gas to the top nozzle 150 of the process chamber 110. In some embodiments, the cleaning gas (if used) may enter the process chamber 110 at other locations.

A system controller 160 regulates the operation of the plasma-based substrate processing system 100 and includes a processor 162 and a memory 164. Typically, the processor 162 is part of a Single-Board Computer (SBC), which includes analog and digital input/output boards, interface boards and stepper motor controller boards. Various components of the plasma-based substrate processing system 100 conform to the Versa Modular European (VME) standard, which defines board, card cage, as well as connector type and dimensions. The VME standard further defines the bus structure as having a 16-bit data bus and a 24-bit address bus. The processor 162 executes system control software, which may be a computer program stored in the memory 164. Any type of the memory 164 may be employed, such as a hard disk drive, a floppy disk drive, a card rack or a combination thereof. The system control software includes sets of instructions that dictate the timing, mixture of gases, process chamber pressure, process chamber temperature, microwave power levels, pedestal position, and other parameters of a particular process.

Figure 4:
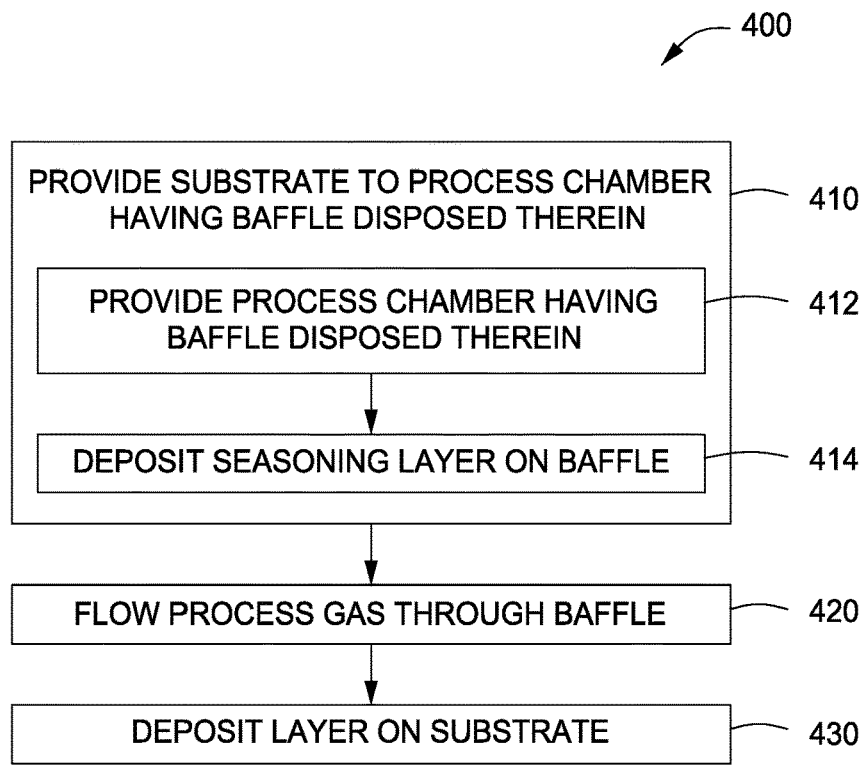
FIG. 4 depicts a flow chart for a method of processing a substrate in accordance with some embodiments of the present invention.

In operation, the HDP-CVD chamber 100 may be utilized to advantageously process a substrate 106 with reduced incidence of particle contamination and extended baffle life. For example, a method for processing a substrate using a baffle in accordance with the teachings provided herein is discussed below with respect to FIG. 4. FIG. 4 is a flow chart illustrating a method 400 of processing a substrate in accordance with some embodiments of the present invention. The method 400 of FIG. 4 is further described with reference to FIGS. 1 and 2A-B.

The method 400 begins at 410 wherein a substrate may be provided to a process chamber having a baffle disposed therein in accordance with the teachings disclosed herein. For example, a substrate 106 may be placed on the substrate support 102 of the process chamber 110, below the baffle 200. In some embodiments, the process chamber and the baffle may be seasoned prior to processing the substrate to facilitate uniform processing of the substrate and to protect chamber components from the process environment during processing. For example, at 412, a process chamber (e.g., process chamber 110) may be provided having a baffle (e.g., baffle 200) disposed therein. At 414, a seasoning layer, such as silicon oxide ($SiO_2$) may be formed on the baffle 200 (e.g., on the surface of the baffle 200). The seasoning layer may be formed in any suitable manner. However, a more uniform seasoning layer may be formed on the baffle 200, due to the reduced presence of metal oxide on the surface thereof and/or due to the surface treatment of the aluminum nitride.

Next, at 420, a process gas may be flown through the baffle 200 and into the process chamber 110. For example, one or more process gases may be provided from the gas delivery system 118 into the plasma processing region 120 at least through the baffle 200 (for example via inlet 208, channels 209, and outlets 210 shown in FIGS. 2A-B). The one or more process gases may alternatively or in combination be supplied to the plasma processing region 120 via the top vent 152 (e.g., a third gas inlet) to flow from the backside 203 to the frontside 201 via the edge of the outer annulus 206 and/or through the holes 212. The one or more process gases may be mixed in the plasma processing region 120 and may be ignited into a plasma by applying RF power to one or more of an electrode disposed in the substrate support 102, the top coil 138, or side coil 140.

At 430, a layer (not shown) may be deposited on the substrate 106. The layer deposited on the substrate 106 may advantageously have reduced particle defects due to the more uniform seasoning layer disposed on the baffle 200 and the improved adhesion of the seasoning layer thereto. Upon completion of depositing a layer upon the substrate 106, the method 400 generally ends. Additional processing of the substrate may occur in the same or in different process chambers to complete the fabrication of the structures on the substrate 106. Although a particular process has been illustratively shown in an illustrative process chamber, other processes may also be advantageously performed in similar or different process chambers having a baffle disposed therein in accordance with the present teachings. For example, the baffle 200 may be utilized to flow one or more process gases in the absence of forming a plasma, for example, in non-plasma assisted CVD process, atomic layer deposition (ALD) processes, or other processes that utilize seasoning layers to protect the surface of the baffle. It is also contemplated that the baffle 200 may be utilized in other processes such as etching and the like, which may advantageously utilize a baffle as described herein.

Thus, methods and apparatus relating to an improved aluminum nitride baffle have been provided herein. The improved aluminum nitride baffle advantageously has a reduced metal oxide content on the surface of the aluminum nitride baffle. The improved baffle may advantageously facilitate the formation of a more uniform silicon oxide seasoning layer on the surface of the aluminum nitride baffle, and may further advantageously promote greater adhesion of the seasoning layer to the surface of the baffle, thereby improving processing uniformity and reducing particle defects on the surface of a substrate being processed. The improved aluminum nitride baffle may further have a longer life span due to the more uniform coverage of the seasoning layer.

While the foregoing is directed to embodiments of the present invention, other and further embodiments of the invention may be devised without departing from the basic scope thereof, and the scope thereof is determined by the claims that follow.

The invention claimed is:

1. A method of fabricating a baffle for use in a semiconductor process chamber, comprising:
   sintering aluminum, nitrogen and a metal oxide binding agent to form a body of the baffle, the body having excess metal oxide binding agent disposed on a surface thereof; and
   removing a bulk of the excess metal oxide binding agent from the surface.

2. The method of claim 1, wherein removing the bulk of the excess metal oxide binding agent from the surface of the body further comprises:
   removing the bulk of the excess metal oxide binding agent from the surface such that a ratio of aluminum nitride to the metal oxide binding agent on the surface of the body is greater than or equal to the ratio within the body.

3. The method of claim 1, wherein removing the bulk of the excess metal oxide binding agent further comprises:
   removing the bulk of the excess metal oxide binding agent by at least one of sand blasting, grit blasting, wet blasting, mechanical grinding, or mechanical polishing the surface of the body.

4. The method of claim 3, wherein removing the bulk of the excess metal oxide binding agent further comprises:
   exposing the surface of the baffle to a solution comprising a corrosive acid after removing the bulk of the metal oxide binding agent.

5. The method of claim 4, wherein the corrosive acid comprises at least one of nitric acid ($HNO_3$), hydrochloric acid (HCl), or silicon hydride ($SiH_4$).

6. The method of claim 1, wherein the metal oxide binding agent comprises at least one of yttrium oxide or erbium oxide.

7. A method of processing a semiconductor substrate, comprising:
   placing a substrate on a substrate support in a process chamber having an inner volume and a first gas inlet disposed in a ceiling of the process chamber opposite the substrate support;
   flowing a first process gas through a baffle coupled to the first gas inlet and into the inner volume, the baffle comprising an aluminum nitride body having metal oxide binding agents, wherein a ratio of aluminum nitride to the metal oxide binding agent on a surface of the body is greater than or equal to the ratio within the body; and
   processing the substrate with the first process gas.

8. The method of claim 7, further comprising:
   depositing a seasoning layer on the surface of the baffle prior to processing the substrate.

9. The method of claim 7, wherein the body further comprises a center stem and an outer annulus coupled to and extending radially outwards from a lower portion of the center stem, and wherein flowing the first process gas through the baffle further comprises:
   flowing the first process gas through a second gas inlet disposed in an upper portion of the center stem of the baffle, the second gas inlet fluidly coupled to a plurality of gas outlets disposed in a lower portion of the center stem.

10. The method of claim 7, further comprising:
    flowing a second process gas into the inner volume through a third gas inlet disposed in a ceiling of the process chamber and proximate the first gas inlet such that the second process gas contacts a backside of the baffle and is diverted around the baffle towards the substrate support.

11. The method of claim 10, wherein the body further comprises a center stem and an outer annulus coupled to and extending radially outwards from a lower portion of the center stem, and wherein flowing the second process gas further comprises:
    flowing a portion of the second process gas through a plurality of holes formed in the outer annulus to facilitate the flow of the second process gas from the backside of the baffle to a frontside of the baffle.

12. The method of claim 11, further comprising:
    depositing a layer of material on the surface of the substrate resultant from the flows of the first and the second process gases.

* * * * *